United States Patent
Nozawa et al.

(10) Patent No.: US 11,375,605 B2
(45) Date of Patent: Jun. 28, 2022

(54) ELECTRONIC DEVICE

(71) Applicant: Sony Interactive Entertainment Inc., Tokyo (JP)

(72) Inventors: Tetsufumi Nozawa, Chiba (JP); Hiroyuki Katayama, Chiba (JP)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 16/942,931

(22) Filed: Jul. 30, 2020

(65) Prior Publication Data
US 2021/0045230 A1 Feb. 11, 2021

(30) Foreign Application Priority Data

Aug. 8, 2019 (JP) .............................. JP2019-146309

(51) Int. Cl.
*H05K 1/00* (2006.01)
*H05K 1/02* (2006.01)
(Continued)

(52) U.S. Cl.
CPC ........... *H05K 1/0215* (2013.01); *H01R 12/51* (2013.01); *H05K 5/003* (2013.01)

(58) Field of Classification Search
CPC .... H05K 1/0215; H05K 5/003; H05K 5/0247; H05K 9/0039; H05K 9/0022;
(Continued)

(56) References Cited

U.S. PATENT DOCUMENTS

| 6,580,077 B2 | 6/2003 | Ito |
| 9,368,309 B2 | 6/2016 | Mikami |

(Continued)

FOREIGN PATENT DOCUMENTS

| CN | 1237000 A | 12/1999 |
| CN | 1604397 A | 4/2005 |

(Continued)

OTHER PUBLICATIONS

The First Office Action for corresponding CN Application No. 202010781947.6, 13 pages, dated Jul. 6, 2021.

(Continued)

*Primary Examiner* — Anatoly Vortman
*Assistant Examiner* — Zhengfu J Feng
(74) *Attorney, Agent, or Firm* — Matthew B. Dernier, Esq.

(57) ABSTRACT

An electronic device includes a printed board, a frame for fixing the printed board, a connector fixed at a position along one side of a front surface of the printed board, and an electrically conductive member. An indented portion is formed at a position of the one side facing the connector. The electrically conductive member has a portion arranged in the indented portion, and is expanded and contracted in a direction along the one side and a thickness direction of the printed board by an external force. The electrically conductive member has an upper surface, a lower surface, and a side surface in contact, respectively, with a shell of the connector, one surface of the frame, at least one side-surface portion which is part of a portion forming the indented portion and extends along a direction crossing the one side. The electrically conductive member is electrically connected with a ground of the printed board via the side-surface portion.

9 Claims, 4 Drawing Sheets

(51) Int. Cl.
*H01R 12/51* (2011.01)
*H05K 5/00* (2006.01)

(58) Field of Classification Search
CPC .......... H05K 2201/09063; H05K 2201/10189; H05K 7/14; H01R 12/51; H01R 4/64; H01R 12/716; H01R 13/2414; H01R 13/6596; H01R 13/6581
USPC ........................................................ 361/753
See application file for complete search history.

(56) References Cited

U.S. PATENT DOCUMENTS

| | | | |
|---|---|---|---|
| 11,146,027 B2* | 10/2021 | Wang | ................ H01R 13/6594 |
| 2002/0175285 A1 | 11/2002 | Ito | |
| 2004/0207975 A1 | 10/2004 | Saito | |
| 2005/0075004 A1 | 4/2005 | Endou | |
| 2007/0195512 A1 | 8/2007 | Konno | |
| 2009/0120682 A1 | 5/2009 | Ohtsuji | |
| 2009/0168379 A1 | 7/2009 | Maehara | |
| 2013/0328051 A1* | 12/2013 | Franklin | ................ H05K 1/028 |
| | | | 361/679.01 |
| 2014/0240941 A1 | 8/2014 | Mikami | |
| 2015/0216084 A1 | 7/2015 | Huang | |
| 2017/0264034 A1* | 9/2017 | Du | ..................... H01R 13/6594 |
| 2017/0346236 A1* | 11/2017 | Long | .................... H01R 13/659 |
| 2018/0164343 A1 | 6/2018 | Wang | |
| 2019/0237912 A1* | 8/2019 | Little | ..................... H01R 24/60 |

FOREIGN PATENT DOCUMENTS

| | | |
|---|---|---|
| CN | 2884793 Y | 3/2007 |
| CN | 101472435 A | 7/2009 |
| CN | 104023464 A | 9/2014 |
| JP | 10255912 A | 9/1998 |
| JP | 11354945 A | 12/1999 |
| JP | 2004193163 A | 7/2004 |
| JP | 2004319384 A | 11/2004 |
| JP | 2013093815 A | 5/2013 |
| JP | 2013172102 A | 9/2013 |
| JP | 2015090426 A | 5/2015 |

OTHER PUBLICATIONS

Notice of Reasons for Refusal for corresponding JP Application No. 2019-146309, 6 pages, dated Jul. 26, 2021.
Notification of Decision to Grant for corresponding CN Application No. 202010781947.6, 7 pages, dated Feb. 18, 2022.

* cited by examiner

ELECTRONIC DEVICE

CROSS REFERENCE TO RELATED APPLICATIONS

This application claims the benefit of Japanese Priority Patent Application JP 2019-146309 filed Aug. 8, 2019, the entire contents of which are incorporated herein by reference.

BACKGROUND

The present disclosure relates to an electronic device including a connector for establishing a wired communication connection with another electronic device.

Various types of communication interfaces are used for establishing wired communication connections between electronic devices. Those communication interfaces include ones that transmit and receive signals by using relatively fast clocks in order to realize high-speed communication such as universal serial bus (USB) 3.0 or high-definition multimedia interface (HDMI) (registered trademark), for example.

SUMMARY

Electronic devices that transmit and receive signals by using high-speed clocks tend to generate high-frequency noises from their connectors. In particular, in a case that such an electronic device itself executes wireless communication using wireless local area network (LAN) technology, Bluetooth (registered trademark) technology or the like or in a case that there is another nearby electronic device that performs wireless communication, noises generated from a connector have a negative influence on the communication quality of the wireless communication in some cases.

The present disclosure has been made taking into consideration the actual circumstances described above, and it is desirable to provide an electronic device that can effectively suppress noises generated from a connector due to wired communication.

According to an embodiment of the present disclosure, there is provided an electronic device including a printed board, a frame to which the printed board is fixed, a connector that is fixed at a position along one side of a front surface of the printed board and is for establishing a wired communication connection with another electronic device, and an electrically conductive member which is electrically conductive. An indented portion is formed at a position of the one side of the printed board at which the printed board faces the connector. The electrically conductive member has a portion arranged in the indented portion, and has a property of being expanded and contracted in a direction along the one side of the printed board and a thickness direction of the printed board by an external force. An upper surface of the electrically conductive member is in contact with a shell of the connector, a lower surface of the electrically conductive member is in contact with one surface of the frame, and a side surface of the electrically conductive member is in contact with at least one side-surface portion which is part of a portion forming the indented portion of the printed board and extends along a crossing direction that crosses the one side. The electrically conductive member is electrically connected with a ground of the printed board via the side-surface portion.

According to another embodiment of the present disclosure, there is provided an electronic device including a printed board, a frame to which the printed board is fixed, a connector that is fixed at a position along one side of a front surface of the printed board and is for establishing a wired communication connection with another electronic device, and an electrically conductive member which is electrically conductive. An indented portion is formed at a position of the one side of the printed board at which the printed board faces the connector. The electrically conductive member has a portion arranged in the indented portion, and has a property of being expanded and contracted in a thickness direction of the printed board by an external force. A lower surface of the electrically conductive member is in contact with one surface of the frame, and an upper surface of the electrically conductive member includes a portion in contact with a shell of the connector, and a portion in contact with a rear surface of the printed board. The electrically conductive member is electrically connected to a ground of the printed board via the rear surface of the printed board.

DETAILED DESCRIPTION OF THE PREFERRED EMBODIMENTS

Hereinafter, embodiments of the present disclosure are explained in detail on the basis of the drawings.

First Embodiment

An electronic device according to a first embodiment of the present disclosure is a personal computer, a home-use game machine, a portable game machine, or the like, for example, and includes a connector 10 for establishing a wired communication connection with another electronic device. Specifically, the connector 10 may be a receptacle into which a cable complying with the HDMI standard, the USB standard, or the like can be inserted.

Figure 1:
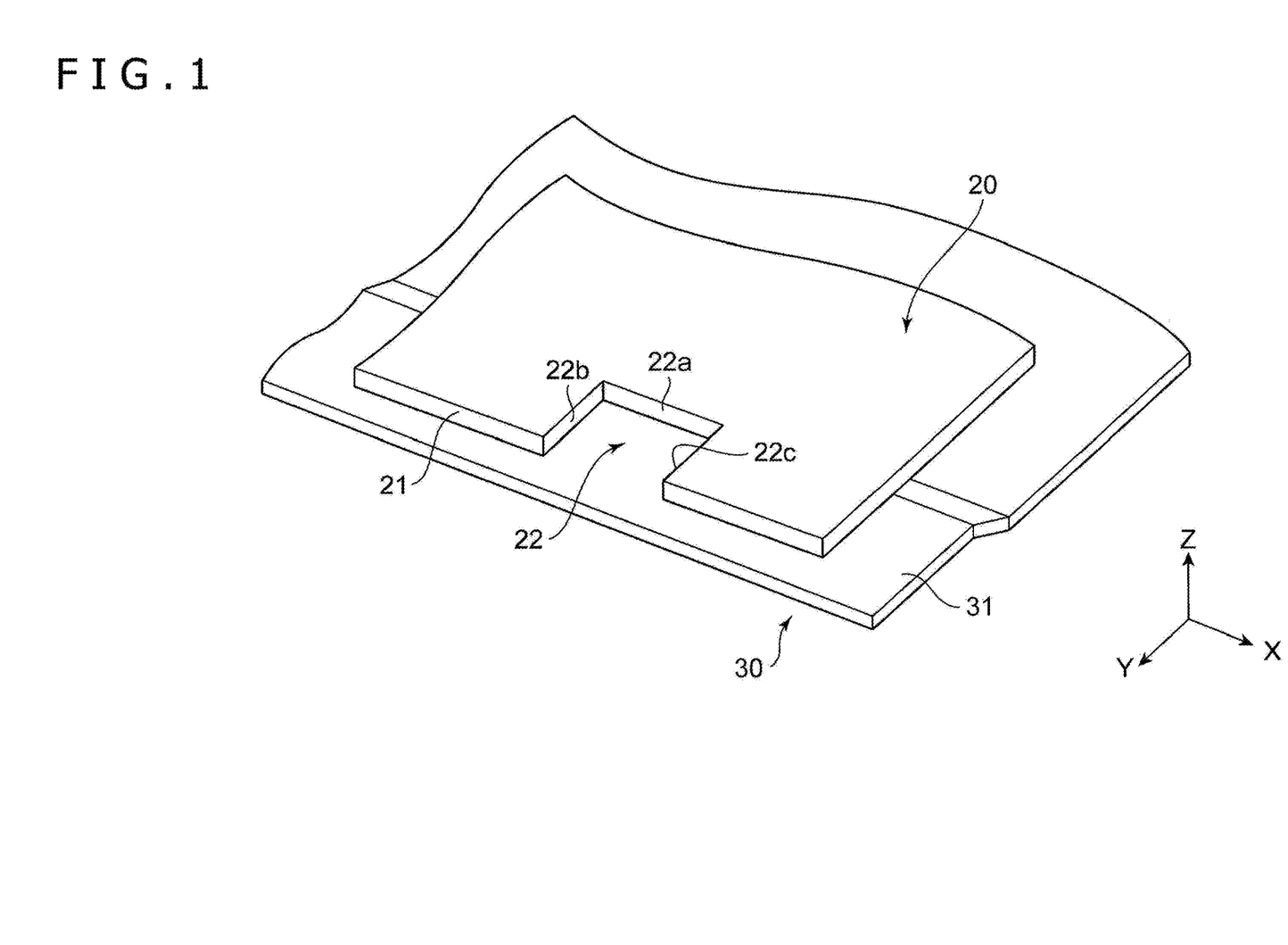
FIG. 1 is a figure schematically illustrating how an electronic device according to a first embodiment of the present disclosure looks before a connector is arranged in the electronic device.
Figure 2:
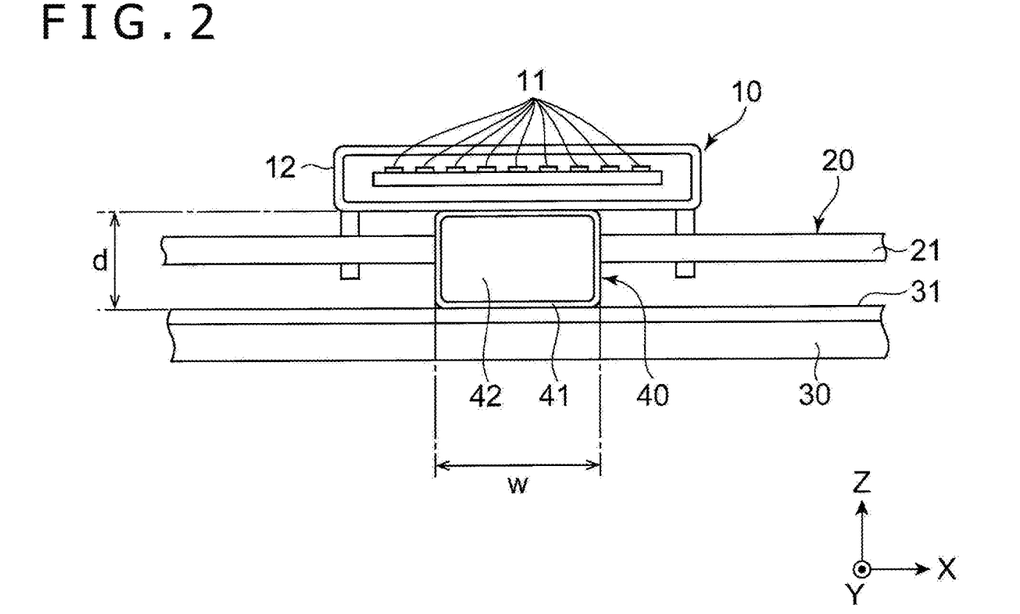
FIG. 2 is a front view schematically illustrating an inside of the electronic device according to the first embodiment of the present disclosure.
Figure 3:
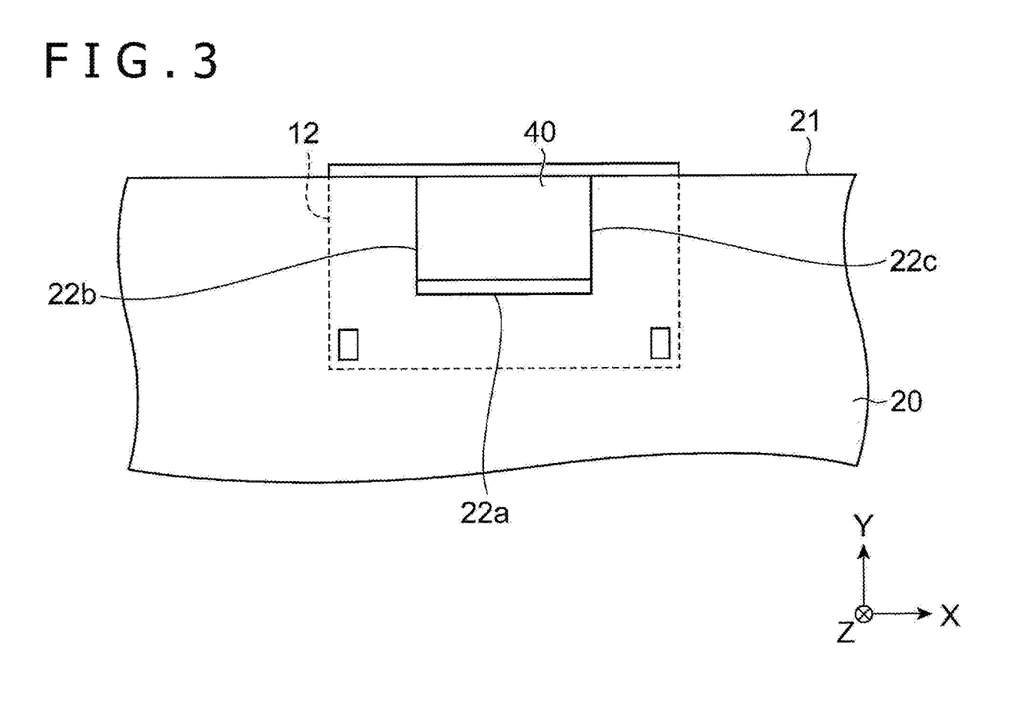
FIG. 3 is a bottom view schematically illustrating the inside of the electronic device according to the first embodiment of the present disclosure.
Figure 4:
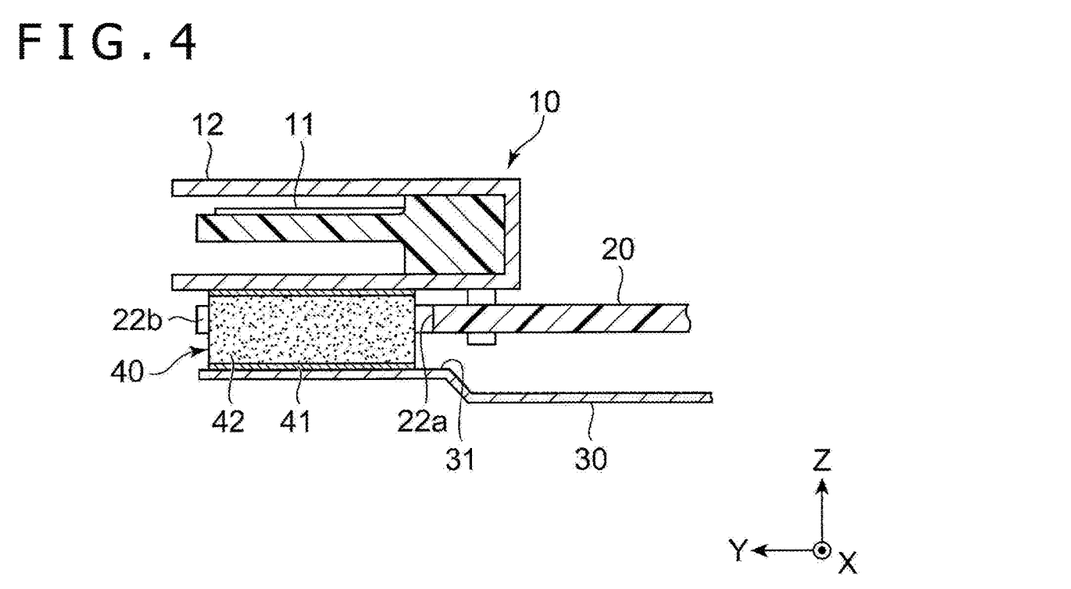
FIG. 4 is a cross-sectional view schematically illustrating the inside of the electronic device according to the first embodiment of the present disclosure.

The electronic device according to the present embodiment includes the connector 10, a printed board 20, a frame 30, and an electrically conductive member 40. FIG. 1 is a partial perspective view illustrating an inside of the electronic device in a state where the connector 10 and the electrically conductive member 40 are not arranged. In addition, FIG. 2, FIG. 3, and FIG. 4 are figures illustrating a manner in which the connector 10 and the electrically conductive member 40 are arranged in the state illustrated in FIG. 1. FIG. 2 is a front view seen from a side where an opening portion of the connector 10 is located, FIG. 3 is a bottom view illustrating the printed board 20 seen from below, and FIG. 4 is a cross-sectional view. Note that the frame 30 is not illustrated in FIG. 3.

The connector 10 includes a plurality of connection terminals 11, and a shell (outer shell) 12 housing the connection terminals 11, and is fixed to the printed board 20 by screws or the like. The shell 12 is formed tubularly with an electrically conductive metal member.

The printed board 20 is arranged inside the frame 30, and a front surface of the printed board 20 is equipped with various types of circuit elements. An electronic circuit including the circuit elements mounted on the printed board 20 realizes functions of the electronic device according to the present embodiment. On the front surface, a rear surface, or an internal layer of the printed board 20, a ground pattern including an electrically conductive material is formed, and this ground pattern functions as a ground of the electronic circuit mounted on the printed board 20. Hereinbelow, the ground of the printed board 20 including the ground pattern is referred to as the board ground.

In the present embodiment, the printed board 20 have a substantially rectangular shape in its plan view, and the connector 10 may be arranged at a position along one side of the rectangular shape. Hereinafter, for convenience of explanation, a direction along the one side of the printed board 20 where the connector 10 is arranged is defined as an X-axis direction, and a direction orthogonal to the X-axis direction and parallel to the front surface of the printed board 20 is defined as a Y-axis direction. In addition, a rightward direction and a leftward direction of the printed board 20 as seen from the side where the connector 10 is arranged are defined as an X-axis positive direction and an X-axis negative direction, respectively, and a nearer side as seen from the same side (i.e., a side where the connector 10 is arranged as seen from a center of the printed board 20) and a farther side are defined as a Y-axis positive direction and a Y-axis negative direction, respectively. Furthermore, a thickness direction of the front surface of the printed board 20 (i.e., a direction orthogonal to all of the front surface of the printed board 20, the X-axis direction, and the Y-axis direction) is defined as a Z-axis direction. A direction from the front surface of the printed board 20 toward an upward direction (a side where the connector 10 is arranged) is defined as a Z-axis positive direction, and a direction from the front surface of the printed board 20 toward a downward direction (a side of the rear surface of the printed board 20) is defined as a Z-axis negative direction. In addition, among side surfaces of the printed board 20, a side surface on the Y-axis positive side (i.e., the side where the connector 10 is arranged) is denoted as a side surface 21.

As illustrated in FIG. 1, the side surface 21 of the printed board 20 has an indented portion 22 formed as a recess in a box shape with one open side when seen in the plan view. The connector 10 is fixed at a position that overlaps the indented portion 22 in the plan view.

The indented portion 22 is defined by three side-surface portions formed on the side surface 21 of the printed board 20. That is, a side-surface portion 22a, a side-surface portion 22b, and a side-surface portion 22c are formed in connection with each other, with their orientations facing the Y-axis positive side, the X-axis positive side, and the X-axis negative side, respectively, and the indented portion 22 is formed as a portion surrounded by the three side-surface portions from three directions. More specifically, the side-surface portion 22a is a surface parallel to an X-Z plane, and positioned on the Y-axis negative side of the indented portion 22. The side-surface portion 22b and the side-surface portion 22c are both surfaces parallel to a Y-Z plane, the side-surface portion 22b is positioned on the X-axis negative side of the indented portion 22, and the side-surface portion 22c is positioned on the X-axis positive side of the indented portion 22. The side-surface portion 22b and the side-surface portion 22c both extend in a direction crossing the X-axis direction (the direction along the side where the connector 10 is arranged), and face each other. Hereinbelow, a width of the indented portion 22 (i.e., a length along the X-axis direction) is denoted as a width w.

Among the three side-surface portions, at least the side-surface portions 22b and 22c have front surfaces that are plated with an electrically conductive material such as copper, and the plated portions constitute part of the board ground of the printed board 20. That is, the electrically conductive material on the front surfaces of the side-surface portions 22b and 22c is electrically connected with the ground pattern formed on the front surface of the printed board 20 or inside the printed board 20. Note that, similarly to the side-surface portions 22b and 22c, the side-surface portion 22a may also be plated and may be part of the board ground of the printed board 20.

The frame 30 is a structure including an electrically conductive member such as a metallic plate, and the printed board 20 is fixed to the frame 30. Specifically, the frame 30 may be a chassis that houses the printed board 20. The frame 30 functions as a frame ground of the electronic device according to the present embodiment. Although a shape of the frame 30 may be any of various shapes, the frame 30 at least has a surface facing the rear surface of the printed board 20 (the rear surface is a surface opposite to the front surface on the side where the connector 10 is arranged). This surface includes an area that overlaps the connector 10 in the plan view (i.e., as seen in a direction perpendicular to the front surface of the printed board 20). Hereinbelow, the surface of the frame 30 facing the rear surface of the printed board 20 is referred to as a facing surface 31. Note that, as illustrated in FIG. 4, in the present embodiment, the facing surface 31 of the frame 30 has such a shape that a distance to the printed board 20 at an end portion of the facing surface 31 on the side where the connector 10 is arranged is shorter than distances at center positions thereof.

As mentioned before, the connector 10 is fixed to the printed board 20 at the position overlapping the indented portion 22 in the plan view. In this state, a lower surface of the shell 12 faces the facing surface 31 of the frame 30 with the indented portion 22 being sandwiched between the lower surface of the shell 12 and the facing surface 31 of the frame 30. A distance between the lower surface of the shell 12 and the facing surface 31 in a state where the connector 10 is fixed to the printed board 20 is defined as a distance d.

The electrically conductive member 40 is an elastic, electrically conductive member, and at least part of the electrically conductive member 40 is arranged to be positioned in the indented portion 22. Due to its elasticity, the electrically conductive member 40 has a property of being expandable and contractible at least along the X-axis direction and the Z-axis direction. Specifically, in the present embodiment, the electrically conductive member 40 is an electrically conductive gasket, and includes a covering 41 formed of an electrically conductive cloth or the like, and a core material 42 housed in the covering 41. The covering 41 is flexible and has a tubular shape extending in the Y-axis direction. Thereby, the electrically conductive member 40 has a cross-sectional shape, as seen from the Y-axis direction, that is deformed in any manner by an external force applied from an outside.

More specifically, the electrically conductive member 40 has a substantially rectangular-parallelepiped shape and has a thickness (a length in the Z-axis direction) which is longer than the distance d in a state where no external force is applied thereto. Thereby, when the electrically conductive member 40 is arranged in the indented portion 22 and the connector 10 is fixed to the printed board 20, the lower surface of the shell 12 presses the electrically conductive member 40 from above, and the electrically conductive member 40 is sandwiched by the lower surface of the shell 12 and the facing surface 31. Thereby, an external force is applied to the electrically conductive member 40 in a direction along the Z-axis direction. Since a stress against the external force is generated due to the elasticity of the electrically conductive member 40 in the Z-axis direction, the electrically conductive member 40 comes into contact with both the lower surface of the shell 12 and the facing surface 31 in such a manner that the electrically conductive member 40 is pushed against both the lower surface of the shell 12 and the facing surface 31. Note that the electrically conductive member 40 is desirably arranged to contact the lower surface of the shell 12 at a position close to a tip portion (i.e., an end portion on the Y-axis positive side) of the lower surface of the shell 12.

Furthermore, a length of the electrically conductive member 40 in the X-axis direction becomes longer than the width W of the indented portion 22 in a state where the electrically conductive member 40 is pressed by the external force along the Z-axis direction. By housing the electrically conductive member 40 in the indented portion 22 and pressing the electrically conductive member 40 with the lower surface of the shell 12 of the connector 10 from above, an external force in a direction along the X-axis direction is applied to the electrically conductive member 40 by being sandwiched by the side-surface portion 22b and the side-surface portion 22c. Since a stress against the external force is generated due to the elasticity of the electrically conductive member 40 in the X-axis direction, the electrically conductive member 40 comes into contact with both of the side-surface portions 22b and 22c in such a manner that the electrically conductive member 40 is pushed against both of the side-surface portions 22b and 22c.

As explained above, in a state where the electrically conductive member 40 and the connector 10 are arranged, the covering 41 of the electrically conductive member 40 contacts the lower surface of the shell 12, the facing surface 31 of the frame 30, the side-surface portion 22b of the printed board 20, and the side-surface portion 22c of the printed board 20 at an upper surface, a lower surface, one side surface, and a side surface opposite to the one side surface of the covering 41, respectively, and also is pushed against those four surfaces due to the elasticity of the electrically conductive member 40. Then, on the side-surface portions 22b and 22c of the printed board 20, an electrically conductive material constituting the board ground of the printed board 20 is formed. Accordingly, by the electrically conductive member 40, which is electrically conductive, coming into contact with each of the shell 12, the frame 30, and the side-surface portions 22b and 22c of the printed board 20, the shell 12 of the connector 10 is electrically connected with both the board ground of the printed board 20 and the frame 30 (frame ground) via the electrically conductive member 40.

The present inventors found out that in order to suppress noises irradiated from the shell 12 of the connector 10 due to communication via the connector 10, it is effective to electrically connect the shell 12 not only to either one of and the frame 30 and the board ground of the printed board 20, but to both of them. In the electronic device according to the present embodiment, it is possible to use the one electrically conductive member 40 to establish relatively short-distance connections between the shell 12, and both the frame 30 and the board ground of the printed board 20. Thereby, noises irradiated from the shell 12 of the connector 10 can be suppressed effectively.

In addition, in the electronic device according to the present embodiment, the electrically conductive member 40 comes into contact with the shell 12 of the connector 10 at a position relatively close to an insertion port of the shell 12. In this manner, by bringing the electrically conductive member 40 into contact with the shell 12 at a position on a tip side (Y-axis positive side) relative to a center of the connector 10 in a depth direction (Y-axis direction), it is possible to electrically connect a portion of the shell 12 on its tip side with the board ground and the frame ground. Thereby, it is possible to effectively suppress noises irradiated from a connecting portion of the connector 10 while the electronic device according to the present embodiment is executing communication with another communication device via the connector 10.

Furthermore, in the electronic device according to the present embodiment, it is possible to easily check at the time of its manufacture whether the electrically conductive member 40 is arranged correctly. If the electrically conductive member 40 is not in contact with each of the shell 12, the printed board 20, and the frame 30 with a sufficient area of contact therebetween due to errors in dimensions of each member, misalignment of an arrangement position of each member, or other causes, it becomes difficult to attain the noise suppression effect. In the present embodiment, at the time of manufacture of the electronic device, the printed board 20 is fixed to the frame 30, and furthermore the connector 10 is fixed to the printed board 20 in a state where the electrically conductive member 40 is arranged in place. By checking the state of the electrically conductive member 40 from the Y-axis positive side (i.e., the side where the opening portion of the connector 10 is located) at a step after completion of mounting of the connector 10 onto the printed board 20 in this manner, it is possible for a human to visually check whether the electrically conductive member 40 is in contact with each of the shell 12, the frame 30, and the side-surface portion 22b and the side-surface portion 22c of the printed board 20, and whether gaps that inhibit sufficient electrical connections are not left between them. Accordingly, it is possible to easily find products which are possibly not able to attain the sufficient noise suppression effect due to defects that have occurred during manufacturing processes or other causes.

Note that the electrically conductive member 40 may contact not only with the side-surface portion 22b and the side-surface portion 22c of the printed board 20, but also with the side-surface portion 22a. At this time, if a front surface of the side-surface portion 22a is plated also, it is possible to make stronger the electrical connection between the electrically conductive member 40 and the board ground of the printed board 20. Alternatively, the electrically conductive member 40 may be electrically connected only with either one of the side-surface portions 22b and 22c. In this case, only one of the side-surface portions 22b and 22c may be plated with an electrically conductive material. In addition, although in the explanations given above, the electrically conductive member 40 is electrically connected with the board ground of the printed board 20 by plating the side-surface portions 22b and 22c with an electrically conductive material, the electrically conductive member 40 may be connected to the board ground by arranging an electrically conductive material on the side-surface portions 22b or 22c by a method other than plating, for example.

The electrically conductive member 40 does not necessarily be adhered to any member among the shell 12, the side-surface portions 22b and 22c of the printed board 20, and the facing surface 31 of the frame 30 as long as the electrically conductive member 40 is in contact with the shell 12, the side-surface portions 22b and 22c of the printed board 20, and the facing surface 31 of the frame 30 with sufficient areas of contact therebetween. However, for convenience of manufacturing processes, the electrically conductive member 40 may be adhered to any of the members by using an electrically conductive adhesive tape or the like. As one example, at the time of manufacture of the electronic device, the electrically conductive member 40 may be adhered to the lower surface of the shell 12, and the connector 10 in that state may be fixed to the printed board 20. Thereby, the electrically conductive member 40 may be arranged in the indented portion 22.

As explained above, with the electronic device according to the present embodiment, noises irradiated from the shell 12 of the connector 10 can be suppressed effectively. In addition, at the time of assembly and manufacture of the electronic device, it is possible to easily find products that may not possibly be able to attain the sufficient noise suppression effect.

Second Embodiment

Hereinafter, an electronic device according to a second embodiment of the present disclosure is explained. In the electronic device according to the present embodiment, constituent elements that realize similar effects to those of the electronic device according to the first embodiment mentioned before are referred to by using the same reference symbols, and detailed explanations thereof are omitted.

Figure 5:
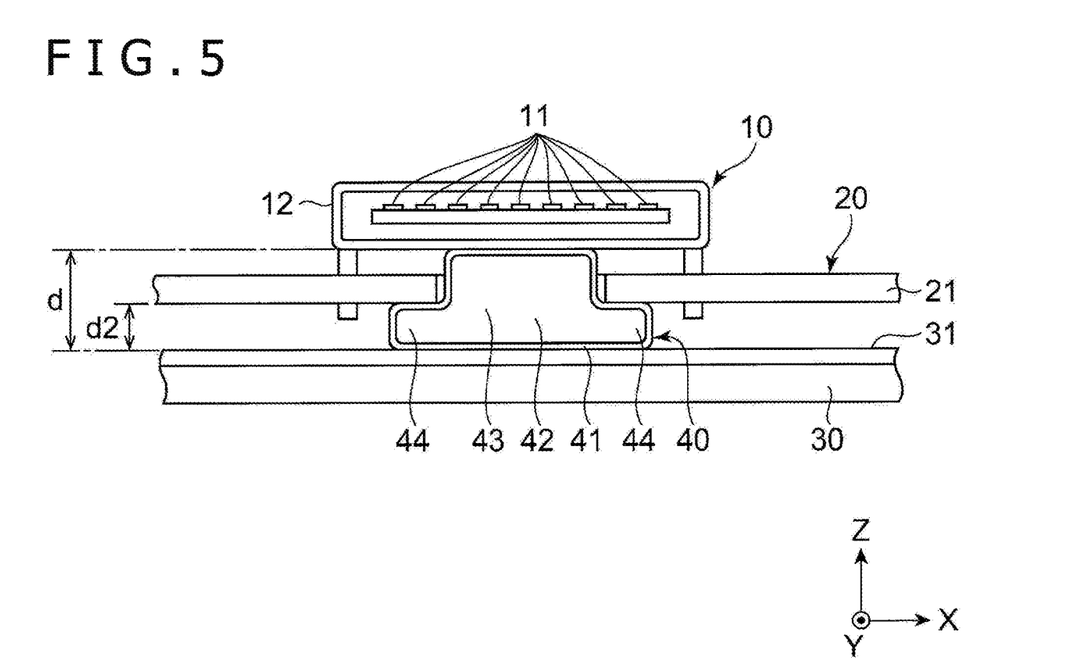
FIG. 5 is a front view schematically illustrating an inside of an electronic device according to a second embodiment of the present disclosure.

In the present embodiment, similarly to the first embodiment, the printed board 20 is fixed to the frame 30, and the connector 10 is fixed to the printed board 20. In addition, at a position of the printed board 20 at which the printed board 20 faces the connector 10, the indented portion 22 in a box shape with one open side is formed. On the other hand, in the present embodiment, the shape of the electrically conductive member 40, and the manner of contact between the electrically conductive member 40 and the printed board 20 are different from those in the first embodiment. FIG. 5 is a front view illustrating a state where the connector 10 and the electrically conductive member 40 are arranged in the electronic device according to the present embodiment.

As illustrated in the figure, the electrically conductive member 40 has a projecting shape as seen in the Y-axis direction, and includes a central portion 43 with a larger height than the periphery, and peripheral portions 44 formed at positions adjacent to the central portion 43 along the X-axis direction. In the present embodiment, two peripheral portions 44 are formed adjacent to the central portion 43 in both the X-axis positive direction and negative direction. These peripheral portions 44 have smaller heights than the central portion 43. The electrically conductive member 40 in the present embodiment may also include the tubular covering 41 extending in the Y-axis direction, and the core material 42 housed in the covering 41. It should be noted however that although the electrically conductive member 40 in the present embodiment has a property of being expandable and contractible along the Z-axis direction, the electrically conductive member 40 does not necessarily expand or contract along the X-axis direction unlike the first embodiment.

In the present embodiment, the electrically conductive member 40 is arranged on the facing surface 31 of the frame 30, and furthermore the printed board 20 is fixed to the frame 30 such that the central portion 43 of the electrically conductive member 40 is included in the indented portion 22. Here, the heights of the peripheral portions 44 in a state where an external force is not applied to the peripheral portions 44 are assumed to be larger than a distance d2 between the rear surface of the printed board 20 (the surface opposite to the front surface onto which the connector 10 is attached) and the facing surface 31 of the frame 30. Accordingly, when the printed board 20 is fixed to the frame 30, the peripheral portions 44 are sandwiched between the rear surface of the printed board 20 and the facing surface 31, and an external force along the Z-axis direction is applied to the peripheral portions 44. Due to a stress against the external force, upper surfaces and lower surfaces of the peripheral portions 44 contact the rear surface of the printed board 20 and the facing surface 31, respectively, in such a manner that the upper surfaces and lower surfaces of the peripheral portions 44 are pushed against the rear surface of the printed board 20 and the facing surface 31, respectively. Note that, similarly to the side-surface portions 22b and 22c in the first embodiment, at locations of the rear surface of the printed board 20 at which the printed board 20 contacts the peripheral portions 44, an electrically conductive material constituting the board ground is formed. This electrically conductive material may be the ground pattern itself. Alternatively, by another method, an electrically conductive material electrically connected with the ground pattern may be arranged at portions of the rear surface of the printed board 20 at which the printed board 20 is contacted by the peripheral portions 44.

Furthermore, in this state, the connector 10 is fixed to the printed board 20 such that the lower surface of the shell 12 contacts an upper surface of the central portion 43. Here, the height of the central portion 43 in a state where an external force is not applied to the central portion 43 is assumed to be larger than the distance d between the facing surface 31 and the lower surface of the shell 12 in a state where the connector 10 is fixed to the printed board 20. Accordingly, when the connector 10 is fixed to the printed board 20, the central portion 43 is sandwiched between the lower surface of the shell 12 and the facing surface 31, and an external force is applied to the central portion 43 along the Z-axis direction. Due to a stress against the external force, the upper surface and a lower surface of the central portion 43 contact the lower surface of the shell 12 and the facing surface 31, respectively, in such a manner that the upper surface and lower surface of the central portion 43 are pushed against the lower surface of the shell 12 and the facing surface 31, respectively.

In this manner, also in the present embodiment, the shell 12 of the connector 10 is electrically connected to the board ground of the printed board 20 and the frame 30 via the electrically conductive member 40. Note that, also in the present embodiment, similarly to the first embodiment, plating may be performed on the side-surface portions 22b and 22c of the printed board 20 with an electrically conductive material, and the electrically conductive member 40 may be arranged at the plated portions such that the electrically conductive member 40 also contacts the plated portions.

Figure 6:
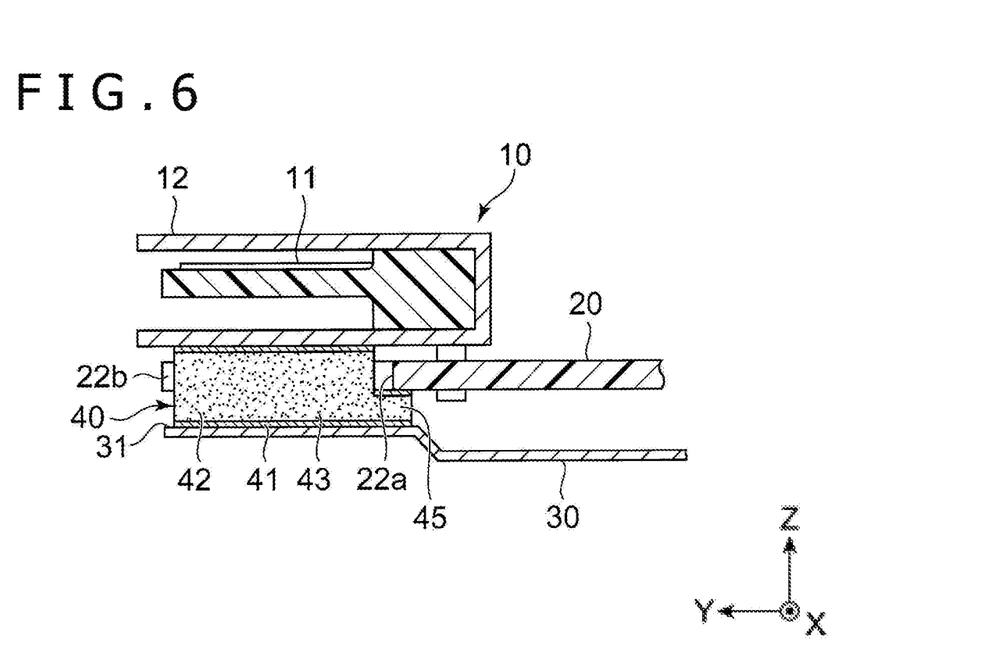
FIG. 6 is a cross-sectional view schematically illustrating a modification of the electronic device according to the second embodiment of the present disclosure.

In the explanations given thus far regarding the present embodiment, the peripheral portions 44 are formed on the X-axis positive side and negative side relative to the central portion 43, and thereby the electrically conductive member 40 has a shape in which the central portion 43 is higher than the left and right peripheral portions 44 when seen in the Y-axis direction. However, a peripheral portion may be formed on the Y-axis negative side relative to the central portion 43. FIG. 6 is a cross-sectional view illustrating the shape of the electrically conductive member 40 in this modification. In this figure, a peripheral portion 45 is formed adjacent to the central portion 43 on the Y-axis negative side (i.e., the center side of the printed board 20). Also in this example, by being sandwiched by the rear surface of the printed board 20 and the facing surface 31 of the frame 30, the peripheral portion 45 contacts the rear surface of the printed board 20 and the facing surface 31 of the frame 30 in such a manner that the peripheral portion 45 is pushed against the rear surface of the printed board 20 and the facing surface 31 of the frame 30. Then, at a position on the rear surface of the printed board 20 at which the printed board 20 contacts the peripheral portion 45, the board ground is formed. Thereby, similarly to the example in FIG. 5, it is possible to electrically connect the lower surface of the shell 12 to both the board ground of the printed board 20 and the frame 30 via the electrically conductive member 40. Note that the electrically conductive member 40 may include both the peripheral portions 44 formed on the X-axis positive side and negative side illustrated in FIG. 5 and the peripheral portion 45 formed on the Y-axis negative side.

Embodiments of the present disclosure are not limited to those explained above. For example, although the electrically conductive member 40 is an electrically conductive gasket in the explanations given above, the electrically conductive member 40 may include another member having electrical conductivity and elasticity of being expandable and contractible in predetermined directions. In addition, the shape of the electrically conductive member 40 illustrated is also merely an example, and the electrically conductive member 40 may have any of various shapes that realize similar effects.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device comprising:
   a printed board;
   a frame to which the printed board is fixed;
   a connector that is fixed at a position along one side of a front surface of the printed board, and is for establishing a wired communication connection with another electronic device; and
   an electrically conductive member, wherein an indented portion is formed at a position of the one side of the printed board at which the printed board faces the connector, and
   the electrically conductive member has a first portion arranged in the indented portion, and has a property of being expanded and contracted in a direction along the one side of the printed board and a thickness direction of the printed board by an external force, an upper surface of the electrically conductive member being in contact with a shell of the connector, a lower surface of the electrically conductive member being in contact with one surface of the frame, a side surface of the electrically conductive member being in contact with at least one side-surface portion which is part of a second portion forming the indented portion of the printed board and extends along a crossing direction that crosses the one side, the electrically conductive member being electrically connected with a ground of the printed board via the at least one side-surface portion.

2. The electronic device according to claim 1, wherein an electrically conductive material that constitutes the ground of the printed board is formed at the at least one side-surface portion, and the electrically conductive member is electrically connected with the ground of the printed board via the electrically conductive material.

3. The electronic device according to claim 1, wherein the electrically conductive member is an electrically conductive gasket.

4. The electronic device according to claim 3, wherein the electrically conductive gasket includes a tubular covering extending in the crossing direction, and a shape of the electrically conductive gasket as seen in the crossing direction is deformed by the external force.

5. An electronic device comprising:
   a printed board;
   a frame to which the printed board is fixed;
   a connector that is fixed at a position along one side of a front surface of the printed board, and is for establishing a wired communication connection with another electronic device; and
   an electrically conductive member, wherein an indented portion is formed at a position of the one side of the printed board at which the printed board faces the connector, and
   the electrically conductive member has a first portion arranged in the indented portion, and has a property of being expanded and contracted in a thickness direction of the printed board by an external force, a lower surface of the electrically conductive member being in contact with one surface of the frame, an upper surface of the electrically conductive member including a second portion in contact with a shell of the connector and a third portion in contact with a rear surface of the printed board, the electrically conductive member being electrically connected to a ground of the printed board via the rear surface of the printed board.

6. The electronic device according to claim 5, wherein an electrically conductive material is formed at a fourth portion of the rear surface of the printed board at which the electrically conductive member contacts the printed board, and the electrically conductive member is electrically connected with the ground of the printed board via the electrically conductive material.

7. The electronic device according to claim 5, wherein the electrically conductive member contacts the rear surface of the printed board at the third portion of the electrically conductive member which is adjacent to the second portion in contact with the shell of the connector in a direction along the one side.

8. The electronic device according to claim 5, wherein the electrically conductive member is an electrically conductive gasket.

9. The electronic device according to claim 8, wherein the electrically conductive gasket includes a tubular covering extending in a crossing direction, and a shape of the electrically conductive gasket as seen in the crossing direction is deformed by the external force.

* * * * *